United States Patent
Kobayashi et al.

[11] Patent Number: 5,912,465
[45] Date of Patent: Jun. 15, 1999

[54] PHOTOELECTRIC CONVERTER

[75] Inventors: Isao Kobayashi, Atsugi; Noriyuki Kaifu, Hachioji; Shinichi Takeda, Atsugi; Kazuaki Tashiro, Hadano; Tadao Endo, Atsugi; Toshio Kameshima, Sagamihara, all of Japan

[73] Assignee: Canon Kabushiki Kaisha, Tokyo, Japan

[21] Appl. No.: 08/697,789

[22] Filed: Aug. 30, 1996

[30] Foreign Application Priority Data

Sep. 5, 1995 [JP] Japan .................................. 7-227853

[51] Int. Cl.$^6$ ...................................... G01T 1/24
[52] U.S. Cl. .................... 250/370.9; 250/370.11; 378/98.8
[58] Field of Search ............... 250/370.9, 370.11, 250/336.1, 369; 378/98.8

[56] References Cited

U.S. PATENT DOCUMENTS

| | | | |
|---|---|---|---|
| 4,376,888 | 3/1983 | Fukuda et al. | 250/211 J |
| 4,931,661 | 6/1990 | Fukaya et al. | 250/578.1 |
| 5,306,648 | 4/1994 | Fukaya et al. | 437/3 |
| 5,338,690 | 8/1994 | Fukaya et al. | 437/3 |
| 5,629,524 | 5/1997 | Stettner et al. | 250/370.09 |

FOREIGN PATENT DOCUMENTS

| | | |
|---|---|---|
| 0660421 | 6/1995 | European Pat. Off. . |
| 62-23944 | 5/1987 | Japan . |
| 63-66117 | 12/1988 | Japan . |

Primary Examiner—Michael J. Tokar
Assistant Examiner—Richard Hanig
Attorney, Agent, or Firm—Fitzpatrick, Cella, Harper & Scinto

[57] ABSTRACT

According to the present invention, provided is a photoelectric converter wherein mounted on substrate are a photoelectric conversion device array portion, which is so formed as to contact two adjacent sides, and a driving circuit portion, which is formed along the other two adjacent sides and that is connected to the photoelectric conversion device array portion, wherein four of the substrates are bonded together with two each being positioned vertically and horizontally, so that the photoelectric conversion device array portions lie adjacent to each other in a plane, and wherein the number, or the shape in a plane, of the photoelectric converter device arrays mounted on at least one of the four substrates differs from the number, or the shape in a plane, of the photoelectric conversion device arrays mounted on at least one of the other three substrates.

25 Claims, 10 Drawing Sheets

PHOTOELECTRIC CONVERTER

BACKGROUND OF THE INVENTION

1. Field of the Invention

The present invention relates to a photoelectric converter, and in particular, to a two-dimensional photoelectric converter that is used for facsimile machines, digital copy machines, and X-ray machines.

2. Related Background Art

Conventionally, a scanning system that employs a reducing optical system and a CCD sensor is used for a scanning apparatus, such as a facsimile machine or a digital copy machine. Recently, however, as a consequence of the development of photoelectric conversion semiconductor material, such as amorphous silicon (hereinafter referred to as a-Si), a so-called close-contact sensor has been developed for which a photoelectric conversion device and a signal processor are formed on a large substrate, and by which data are scanned by using an optical system that has the same magnification rate as that of a data source. Furthermore, since a-Si can be employed not only as a photoelectric conversion material but also as a thin film field-effect transistor film (hereinafter referred to as a TFT), both a photoelectric conversion semiconductor layer and a TFT semiconductor layer can be formed at the same time.

The basic structure of a photoelectric converter that uses a-Si is described in the specification for U.S. Pat. No. 4,376,888, or in Japanese Patent Publication No. 62-23944, or 63-66117.

A specific example for the integral forming of an a-Si photosensor and an a-SI TFT is described in the specifications for U.S. Pat. No. 4,931,661, U.S. Pat. No. 5,338,690 and U.S. Pat. No. 5,306,648.

Based on the techniques disclosed in these specifications, the present inventors produced as a sample photoelectric converter a two-dimensional area type in which the number of pixels was drastically increased. The outline of the photoelectric converter will now be described while referring to FIGS. 1 and 2. This device is disclosed in European Patent Publication No. 0660421.

FIGS. 1 and 2 are plan views of a photoelectric converter that has 2000×2000 pixels. To provide 2000×2000 sensors, the number of photoelectric conversion devices that are included in an arrangement are increased in both the vertical and the horizontal directions. For this converter, 2000 control lines (scan lines) are also required, as is indicated by g1 through g2000, and accordingly, 2000 signal lines (data lines) are required, as is indicated by sig1 through sig2000. In addition, the sizes of a scanning circuit and an integrated circuit used for detection (a detection IC) are increased because they have to control and handle 2000 signal lines. When these processes are performed by single, one-chip ICs, the sizes of the chips must be increased, and the manufacturing efficiency and the prices thereof are adversely affected. As is shown in FIGS. 1 and 2, in a scan circuit, therefore, sufficient shift registers to handle 100 stages, for example, are formed on a single chip and 20 of these scan circuit chips (SR1-1 through SR1-20) are used. For the detection process for the integrated circuit, 100 processing circuits are formed on a single chip, and 20 of these integrated circuit detection chips (IC-1 through IC-20) are used.

In FIG. 1, 20 chips (SR1-1 through SR1-20) are mounted along the left side (L) and another 20 chips (IC-1 through IC-20) are mounted across the down side (D). Connected to each chip by wire bonding are 100 control lines or signal lines. The portion that is enclosed by broken lines in FIG. 1 corresponds to a photoelectric conversion device array that is arranged as a two-dimensional area. The connection of the detection integrated circuit to an external device is not shown.

In another example, shown in FIG. 2, 10 chips (SR1-1 through SR1-10) are mounted along the left side (L) and 10 chips (SR1-11 through SR1-20) are mounted along the right side (R); and 10 chips (IC-1 through IC-10) are mounted across the upper side (U) and 10 chips (IC-11 through IC-20) are mounted across the down side (D). Since in this structure 1000 lines are provided at each of the upper, down, left and right sides (U, D, L and R), the density of the lines arranged along each side is reduced and the concentration of the wire bonding required on each side is also decreased, thus providing an increased manufacturing efficiency. Lines g1, g3, g5, . . . , and g1999 are arranged along the left side (L), while g2, g4, g6, . . . , and g2000 are arranged along the right side (R). That is, the odd numbered control lines are distributed along the left side (L), and the even numbered control lines are distributed along the right side (R). With this arrangement, since each line is pulled out so that the lines are located at equal intervals, the lines are not overly concentrated and the yielding ratio is increased. The wiring across the upper side (U) and the down side (D) is performed in the same manner.

Though not shown, in an additional example, lines g1 through g100, g201 through g300, . . . , and g1801 through g1900 are provided on the left side (L), while lines g101 through g200, g301 through g400, . . . , and g1901 through g2000 are provided on the right side (R). In other words, it is possible for contiguous control lines to be distributed to each chip and for these chips to be alternately sorted to the left side and to be right side (to L and to R). With this arrangement, the control lines for a single chip can be controlled sequentially, the adjustment and the setup of drive timing can be facilitated, a circuit does not become complicated, and an inexpensive IC can be used. The same arrangement can be applied for upper side and the down side (U and D), and an inexpensive IC that can perform a continuous process can be used.

During the manufacturing process for a photoelectric converter having large dimensions, however, it is difficult to completely remove minute dust particles; it is especially difficult to remove a contaminant that is peeled off the wall of a thin film deposition device before a semiconductor layer, such as an amorphous silicon layer, is deposited on a substrate, and it is also difficult to remove dust that remains on a substrate before a metal layer is deposited on the substrate. Therefore, it is difficult to eliminate wiring defects, i.e., short circuits or open circuits in lines.

When the short circuits or open circuits in the control lines or the signal lines occur in a photoelectric converter having large dimensions, all of the output signals of the photoelectric converter devices that are connected to the short-circuit are rendered inexact, and the converter can not function as a photoelectric converter.

In other words, as the size of one substrate is increased for the fabrication of a photoelectric converter having large dimensions, losses due to defects that occur during the manufacture of a substrate are also increased.

When substrates of only one size are bonded together to provide a photoelectric converter, the size of the resultant device having large dimensions is limited to a multiple of the original substrate size, such as twice, four times, or six times the size.

Further, if the selection of control lines (scanning) is so designed that it is performed in the order corresponding to the direction indicated by arrow AL1 in FIG. 2, the order in which the output terminals for each of the scan circuits SR1-1 through SR1-10 are arranged on the left side (L) in FIG. 2 is the opposite of the order in which the output terminals for each of the scan circuits SR1-11 through SR1-20 are arranged on the right side R. When the scan circuits that are arranged on both sides are formed by using IC chips having the same structure, connection lines (lines for connecting control lines to the output terminals of the scan circuits) on either the right or the left side must be formed of multi-layer lines, etc. As a result, the structure of the connection lines becomes complicated and expensive, and the high-density mounting of scan circuits is prevented.

Two types of ICs are prepared for which the orders in which output terminals are located differ, and ICs of one type are arranged on the left, while ICs of the other type are arranged on the right. However, the manufacture of two types of ICs, even though their basic operations are the same, results in higher manufacturing costs.

The above described shortcomings not only apply to scan circuits, but also apply to detection ICs (IC-1 through IC-20) for the output of read signals in a time series.

SUMMARY OF THE INVENTION

It is, therefore, a first object of the present invention to reduce manufacturing costs for a photoelectric converter having large dimensions by providing an increased yielding ratio for each substrate during fabrication of photoelectric converter having large dimensions, and by reducing losses due to defects in each substrate.

It is a second object of the present invention to provide better throughput to accompany an improved efficiency for an inspection procedure during fabrication of photoelectric converters having large dimensions, and to reduce total manufacturing costs that accompany a reduction in the number of components.

It is a third object of the present invention to provide a photoelectric converter in which the number of the sizes of the device that can be obtained by bonding substrates together can be increased.

It is a fourth object of the present invention to provide a photoelectric converter wherefor the types of driving circuits are not increased and where complicated connections are not employed.

To achieve the above objects, according to the present invention, a photoelectric converter is provided wherein a plurality of substrates, on which photoelectric conversion devices are mounted two-dimensionally, are so bonded together that the photoelectric conversion devices are located adjacent to each other in a plane.

The plurality of substrates have a side along which is formed a photoelectric conversion device portion on which the plurality of photoelectric conversion devices are arranged in a plane, and a side along which is formed a circuit portion that is connected to the photoelectric conversion portion, with the plurality of substrates being so bonded together that the photoelectric conversion device portions are arranged adjacent each other in a plane and with no intervening gap.

Each of the plurality of substrates includes the photoelectric conversion device portion that is so formed that it contacts two adjacent sides of the substrate, and the circuit portion that is formed along the other two adjacent sides and that is connected to the photoelectric conversion device portion. Four of the substrates having the same structure are positioned by being rotated 90° in a plane, and the substrates are bonded together with two each being vertically and horizontally positioned, so that the photoelectric conversion device portions lie adjacent to each other in a plane with no intervening gaps.

Mounted on each of the substrates are the photoelectric conversion device portions in which are a first electrode layer, an insulating layer, a photoelectric conversion semiconductor layer, and a semiconductor layer for preventing introduction of a first conductive carrier;

photoelectric conversion means for retaining, in the photoelectric conversion semiconductor layer, the first conductive carrier that is generated by signal light that has entered there and for applying an electric field to the photoelectric conversion devices in a direction in which a second conductive carrier, which is different from the first conductive carrier, is guided to the second electrode layer;

refresh means for applying an electric field, to the photoelectric conversion devices, in a direction in which the first conductive carrier is guided from the photoelectric conversion semiconductor layer to the second electrode layer; and a signal detector for, during photoelectric conversion by photoelectric conversion means, detecting the first conductive carrier that is stored in the photoelectric conversion semiconductor layer, or the second conductive carrier that is guided to the second electrode layer.

According to the present invention, since a efficiency for each substrate during the fabrication process can be increased and losses due to defects on the substrates are reduced, the cost of manufacturing a photoelectric converter having large dimensions can be reduced.

Further, as it is possible to improve the efficiency of an inspection procedure and the throughput that accompanies it, and to reduce the number of required components, and as a result, the cost of manufacturing a photoelectric converter having large dimensions can be reduced.

According to the present invention, the connections for driving circuits need not be increased and need not be complicated.

According to the present invention, since the substrates of different sizes are employed and bonded together, the resultant device size can be varied.

Furthermore, a photoelectric converter wherein the amount of incident light can be detected, as the photoelectric conversion device has only one introduction prevention layer, can be provided at a low price; the optimizing of the process is easy and the yielding ratio can be increased; the manufacturing cost can be reduced; and the SN ratio is high.

The exposure apparatus that employs the above converter differs from conventional X-ray film in that it can project its output very quickly, and in that image processing and data storage are also possible. It has better sensitivity than the film, and a clear image can be obtained with a weak X-ray that will have little adverse effect on a human body.

When the substrates are bonded in consonance with the locations of the substrates when the film is deposited, the characteristics of the photoelectric conversion devices on different substrates that are at the least located at positions adjacent to each other on different substrates can be sequentially equalized.

DETAILED DESCRIPTION OF THE PREFERRED EMBODIMENTS

The preferred embodiments will now be described in detail while referring to the accompanying drawings.

First Embodiment

Figure 2:
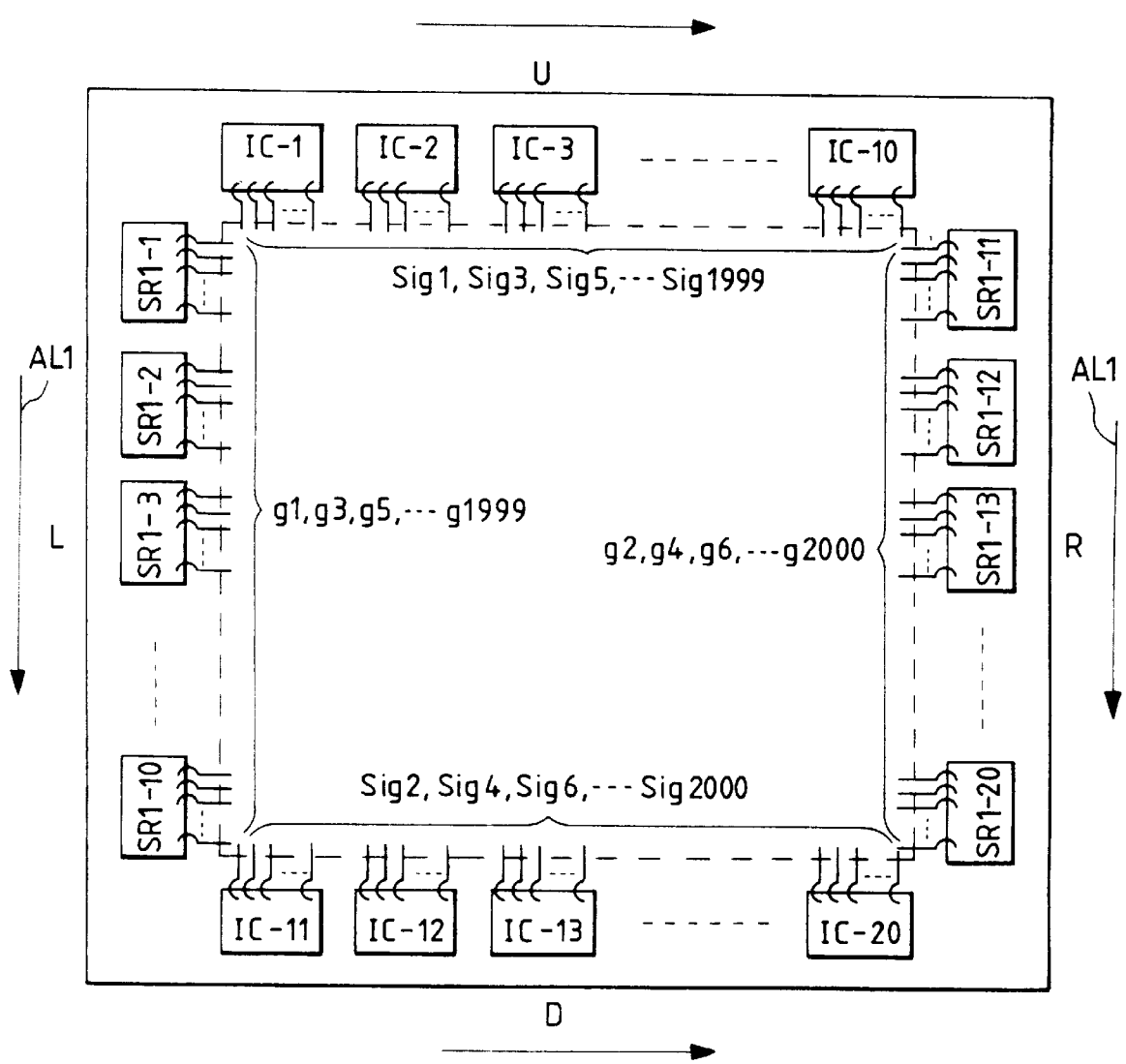
FIG. 2 is a plan view of another conventional photoelectric converter that has 2000×2000 pixels.
Figure 3:
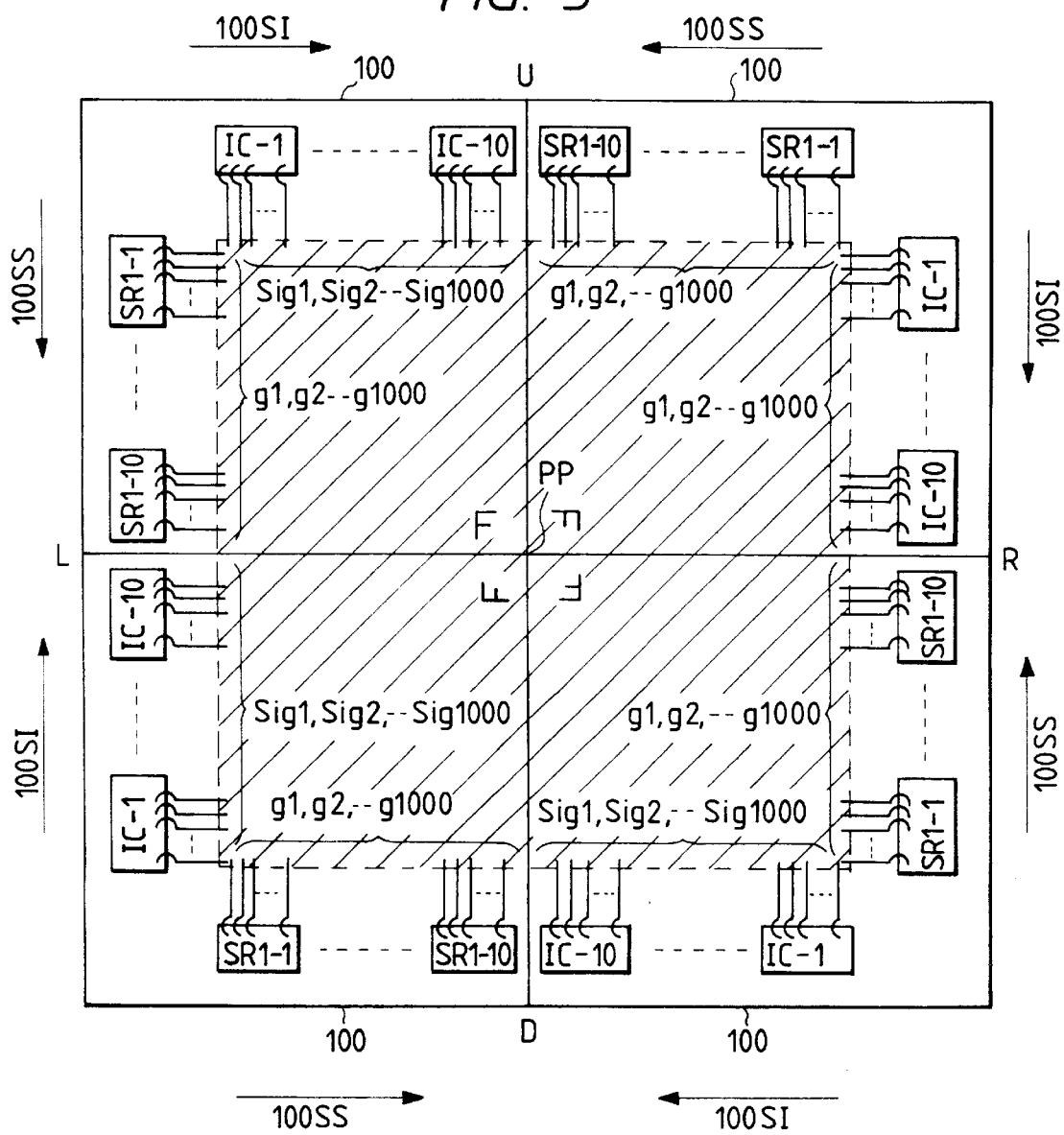
FIG. 3 is a plan view of the overall structure of a photoelectric converter according to a first embodiment of the present invention.

FIG. 3 is a plan view of the overall structure of a photoelectric converter according to a first embodiment of the present invention. The reference numerals are used to denote corresponding or identical components in FIGS. 1 and 2, and no explanation will be given for them.

As the feature of the photoelectric converter shown in FIG. 3, while photoelectric converters 100, 200, 300 and 400 mounted on four substrates are bonded with no gaps between them, to constitute a single large photoelectric converter.

Located on each substrate 100, on which the photoelectric conversion device array is to be mounted, are 1000×1000 photoelectric devices (shaded portion) that are connected to 2000 lines, i.e., 1000 control lines g1 through g1000 and 1000 signal lines sig1 through sig1000. And as there are 100 scan circuits SR1 formed on a single IC chip, there are a total of 10 IC chips SR1 through SR1-10 located on the substrate 100, the IC chips being connected to the respective control lines g1 through g1000.

As for the detection integrated circuits, 100 processing circuits are integrated on a single IC chip, with 10 detection integrated circuit chips, IC-1 through IC-10, being located on each substrate and with the IC chips being connected to the signal lines sig1 through sig1000.

The other substrates 200, 300 and 400, on which the photoelectric conversion device arrays are mounted, have the same structured as the substrate 100, and have 1000× 1000 photoelectric conversion devices arranged on it that are connected to 1000 control lines and 1000 signal lines. Also provided are 10 of the scan circuits and 10 of the detection integrated circuits. Although for each substrate these scan circuits and the integrated circuits may differ, it is preferable that a single type of IC be used for all the substrates, as will be described later. Thus, the four photoelectric conversion device arrays on the four substrates can be scanned at the same time. In this case, when compared with the example shown in FIG. 1, the period of time required for the scanning can be reduced to ¼ of that required for the example in FIG. 1.

In FIG. 3, concerning the scan directions on each substrate, the scan circuits SR1-1 through SR1-10 employ the direction indicated by arrow 100ss, while the detection circuits IC-1 through IC-10 employ the direction indicated by arrow 100SI.

The device shown in FIG. 3 is so structured that the substrates on which are mounted the photoelectric conversion arrays having the same structure are rotated 90° relative to each other and positioned. In other words, when the upper left substrate 100 is rotated clockwise 90° around point pp, it is located at the position for the upper right substrate 100. When the substrate 100 is rotated a further 90°, it reaches the position for the lower right substrate 100. When the substrate 100 is rotated another 90°, it reaches the position for the lower left substrate 100. The position of the lower left substrate 100 is where the upper left substrate 100 is located when from its upper left position it is rotated 90° counterclockwise around point pp.

The scan circuits SR1-1 through SR1-10 and the detection circuits IC-1 through IC-10 are respectively arranged along the four sides of the photoelectric converter having large dimensions.

In the example in FIG. 3, the scan direction 100SS for the scan circuits on the individual sides is the opposite of the scan direction 100SI for the detection circuits. However, either one of the scan directions can be reversed, so that the scan directions for the scan circuits and the detection circuits along each of the sides are the same.

Signals that are output by the detection circuits IC-1 through IC-10 on the four substrates are stored in four memories (not shown), which are provided for corresponding substrates. Coordinate transformation is performed on the signals as needed so that they correspond to physical pixel coordinates in FIG. 3. As a result, the image of an input object can be reproduced on a display device.

The scan circuit has a shift register that shifts in a single direction, and the scan direction is determined by the shift direction of the shift register.

The detection circuit also has a shift register that shifts in a single direction, and the order in which signals are fetched or the order in which the fetched signals are output (the scan direction) is determined by the shift direction of the shift register.

According to the present invention, only IC chips having the same structure are required to constitute the scan circuits and the detection circuits, and accordingly, the driving circuit for the photoelectric converter can be formed. Thus, the cost of manufacturing the driving circuit is not high.

Further, it is not necessary for multi-layer wiring to be employed to connect the scan circuits and the detection circuits to the control lines and signal lines of the photoelectric conversion device array. A simple connection is required, so that the manufacturing cost is not increased.

Although there is a method that can be used to bond substrates together after the IC chips have been connected to them, it is preferable that the connection of the individual IC chips be performed, using an anisotropic adhesive, after four substrates have been bonded together.

The photoelectric device arrays are fabricated on the four substrates, as is shown in FIG. 3, and the four substrates are bonded together with as a small gap as possible between them, so that a photoelectric converter having large dimensions can be constituted. As a result, the yielding ratio for each substrate can be increased, and the losses that are incurred due to defects on the individual substrates can be reduced.

Figure 1:
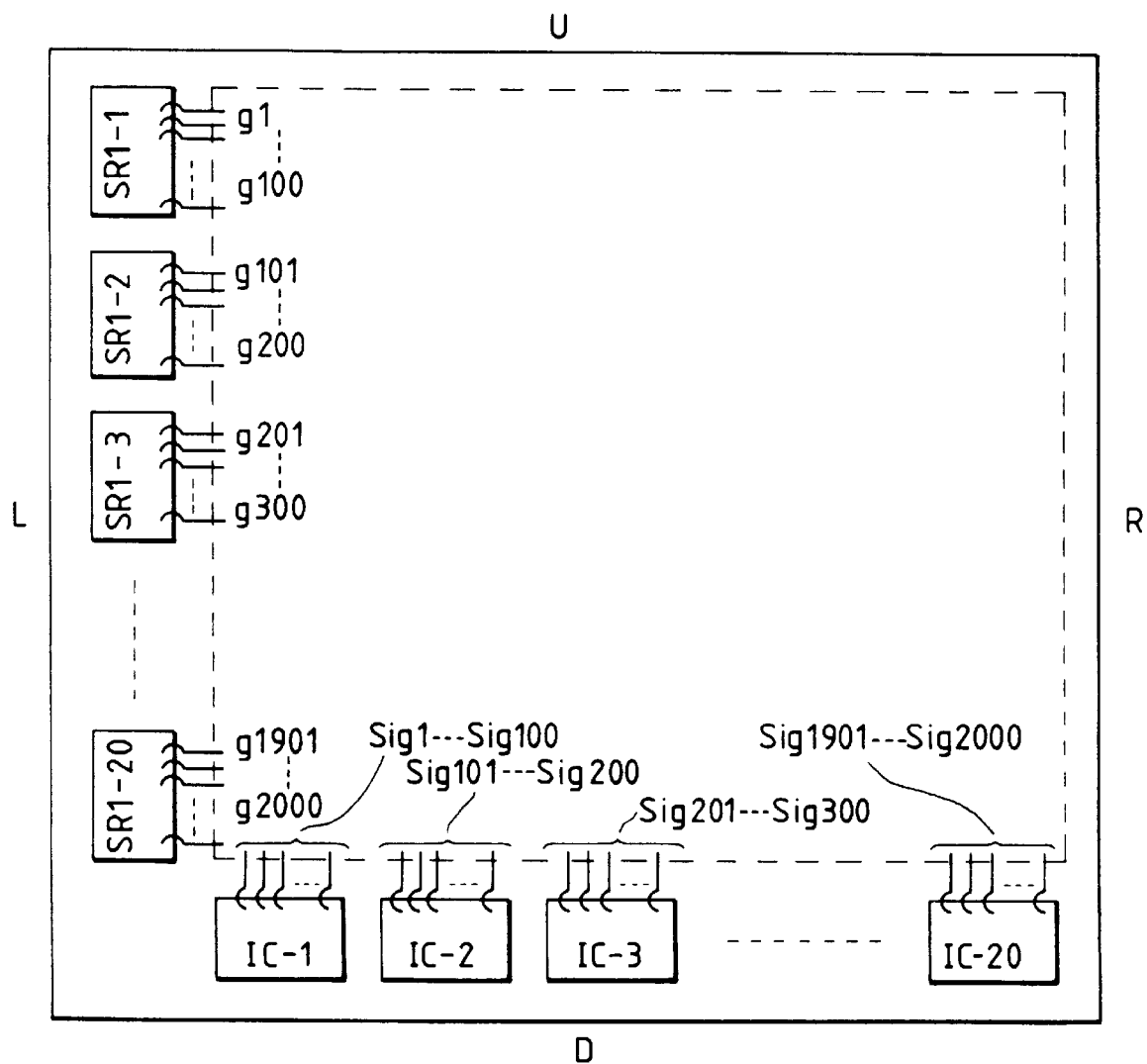
FIG. 1 is a plan view of a conventional photoelectric converter that has 2000×2000 pixels.

Specifically, when the area of the photoelectric converter in FIG. 3 on which photoelectric conversion devices are mounted is the same as the area of the photoelectric converter in FIG. 1 on which photoelectric conversion devices are mounted, the total length of all of the control lines and all of the signal lines for the substrates in FIG. 3 is about ¼ the total length of all the control lines and signal lines for the photoelectric converter in FIG. 1.

In such a photoelectric converter, a short circuit or an open circuit in a control line or in a signal line causes all of the output signals of the photoelectric conversion devices connected to the line to become inaccurate, and the photoelectric converter can not be employed. The possibility of the occurrence of such a defect is substantially proportional to the total length of all the control lines and signal lines, and as a result of such a defect, the yielding ratio will be reduced.

Therefore, a yielding ratio due to a defect in the wiring for each substrate in FIG. 3 is about four times the yielding ratio for the photoelectric converter shown in FIG. 1. The loss that is occasioned when a defect occurs on one substrate shown in FIG. 3 and the photoelectric converter can not be used is proportionate to the dimensions of all the substrates. The loss, therefore, is about ¼ of that experienced as a loss by the photoelectric converter in FIG. 1 when a defect occurs and the converter can not be used.

Figure 4:
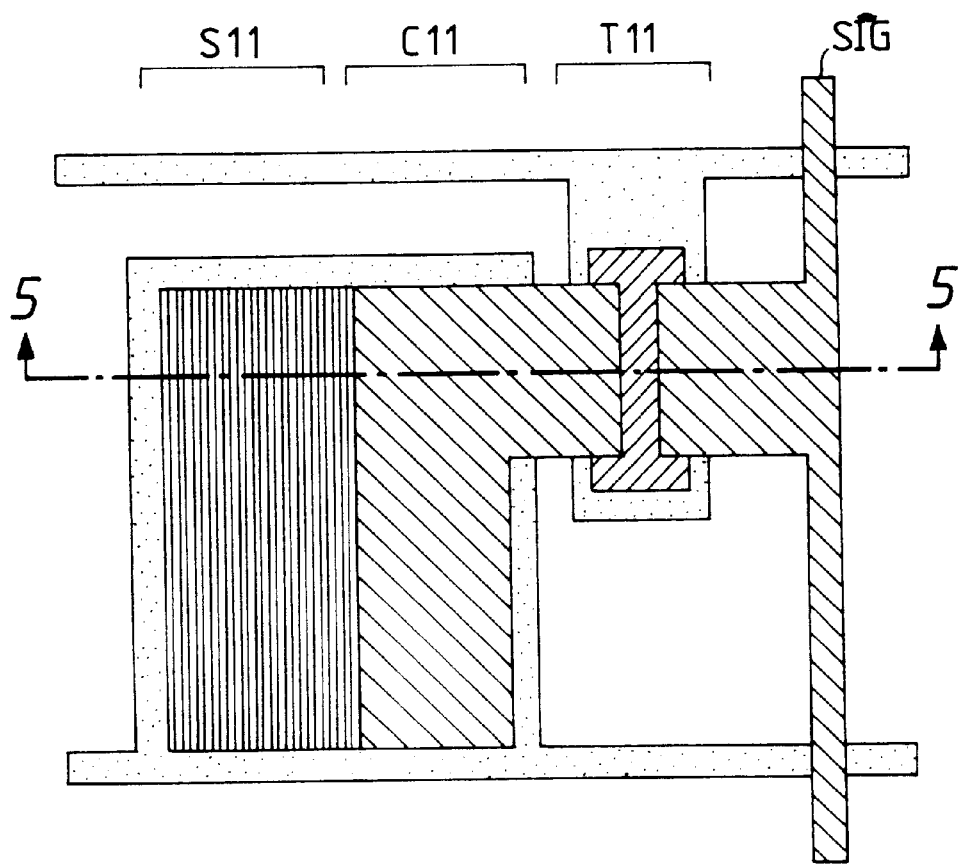
FIG. 4 is a cross sectional view of a photoelectric conversion device according to the first embodiment of the present invention.
Figure 5:
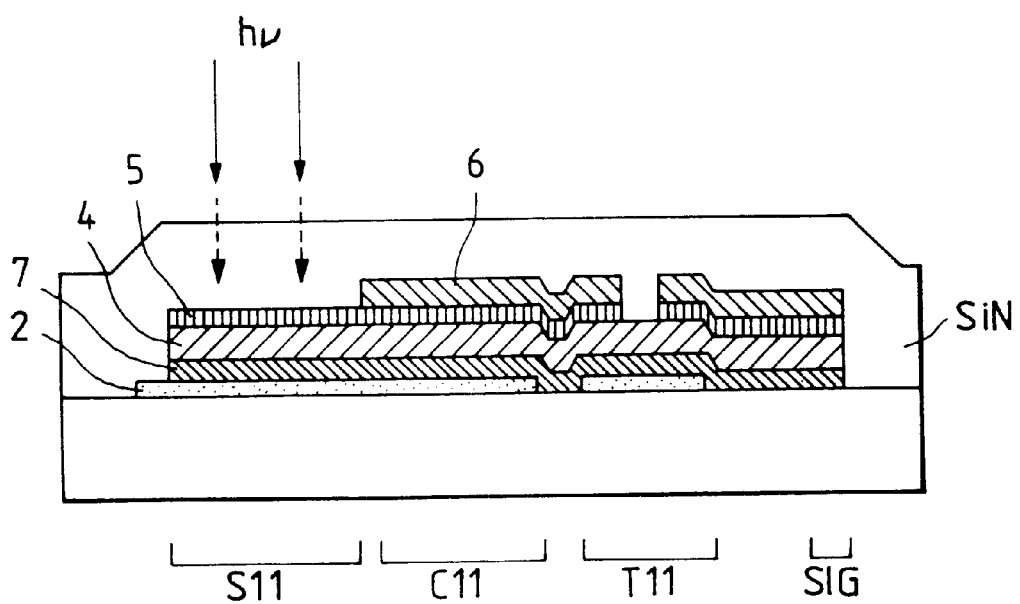
FIG. 5 is a cross sectional view of the scan structure taken along line 5—5 in FIG. 4.

As is shown in FIGS. 4 and 5, provided as the structure on the photoelectric converter are photoelectric conversion devices, each of which is a laminate composed of a first electrode layer 2, an insulating layer 7, a semiconductor layer 4 that can perform photoelectric conversion, a semiconductor layer 5 for preventing introduction of a first conductive carrier, and a second electrode layer 6. The photoelectric converter comprises: photoelectric conversion means for accumulating, on the semiconductor layer 5, the first conductive carrier, which is induced by signal light that enters the semiconductor layer 5, and for providing an electric field to a light receiving device in a direction in which the second conductive carrier, which differs from the first conductive carrier, is to be guided to the second electrode layer 6; refresh means for providing an electric field for the light receiving devices in a direction in which the first conductive carrier is to be guided from the semiconductor layer to the second electrode layer; and a signal detector for detecting the first conductive carrier, which is accumulated on the semiconductor layer, or the second conductive carrier, which is guided to the second electrode layer, during photoelectric conversion performed by the photoelectric conversion means.

In FIGS. 4 and 5, S11 denotes a light-receiving device; T11, a TFT; C11, a capacitor; and SIG, a signal line. The capacitor C12 and the light-receiving device S11 are not separated from each other, and they can be integrally formed because the light-receiving device, the capacitor and the TFT have substantially the same layer structure. A silicon nitride film SiN is deposited as a passivated film on the upper portion of a pixel. When light enters the photoelectric conversion device from upward, the light is converted into an electric signal (accumulated electric change amount).

Second Embodiment

A photoelectric converter according to a second embodiment of the present invention is the same as that shown in FIG. 3.

The feature of the photoelectric converter of this embodiment, photoelectric conversion device arrays on four substrates have the same structure. Further, the four substrates on which the photoelectric conversion devices are mounted are rotated 90° each other in a plane and are bonded together with no gaps to provide a single large photoelectric converter. The arrays having the same structure are fabricated through the same manufacturing process.

Located on each substrate 100 are 1000×1000 photoelectric devices that are connected to 2000 lines, i.e., 1000 control lines g1 through g1000 and 1000 signal lines sig1 through sig1000. And as there are 100 scan circuits SR1 integrated on a single IC chip, there are a total of 10 IC chips SR1 through SR1-10 located on the substrate 100, the IC chips being connected to the respective control lines g1 through g1000.

As for the detection integrated circuits, 100 processing circuits are integrated on a single IC chip, with 10 detection integrated circuit chips, IC-1 through IC-10, being located on each substrate and with the IC chips being connected to the signal lines sig1 through sig1000. The same scan circuits and the integrated circuits are used for all the substrates. The four photoelectric conversion device arrays on the four substrates can be scanned at the same time. In this case, when compared with the example shown in FIG. 9, the period of time required for the scanning can be reduced to ¼ of that required for the example in FIG. 9.

The four substrates are prepared on which photoelectric conversion devices and wiring at a predetermined pattern are formed. On each of the substrates, the scan circuits and detection integrated circuits are mounted. The resultant four substrates are rotated 90° and are bonded together with no gaps between them, so as to constitute a photoelectric converter having large dimensions. As a result, the number of required components can be reduced. The inspection procedure can be performed by two types of devices, and the efficiency of the inspection procedure and the accompanying throughput can be increased. As a result, the cost of manufacturing a photoelectric converter having large dimensions can be reduced.

Third Embodiment

Figure 6:
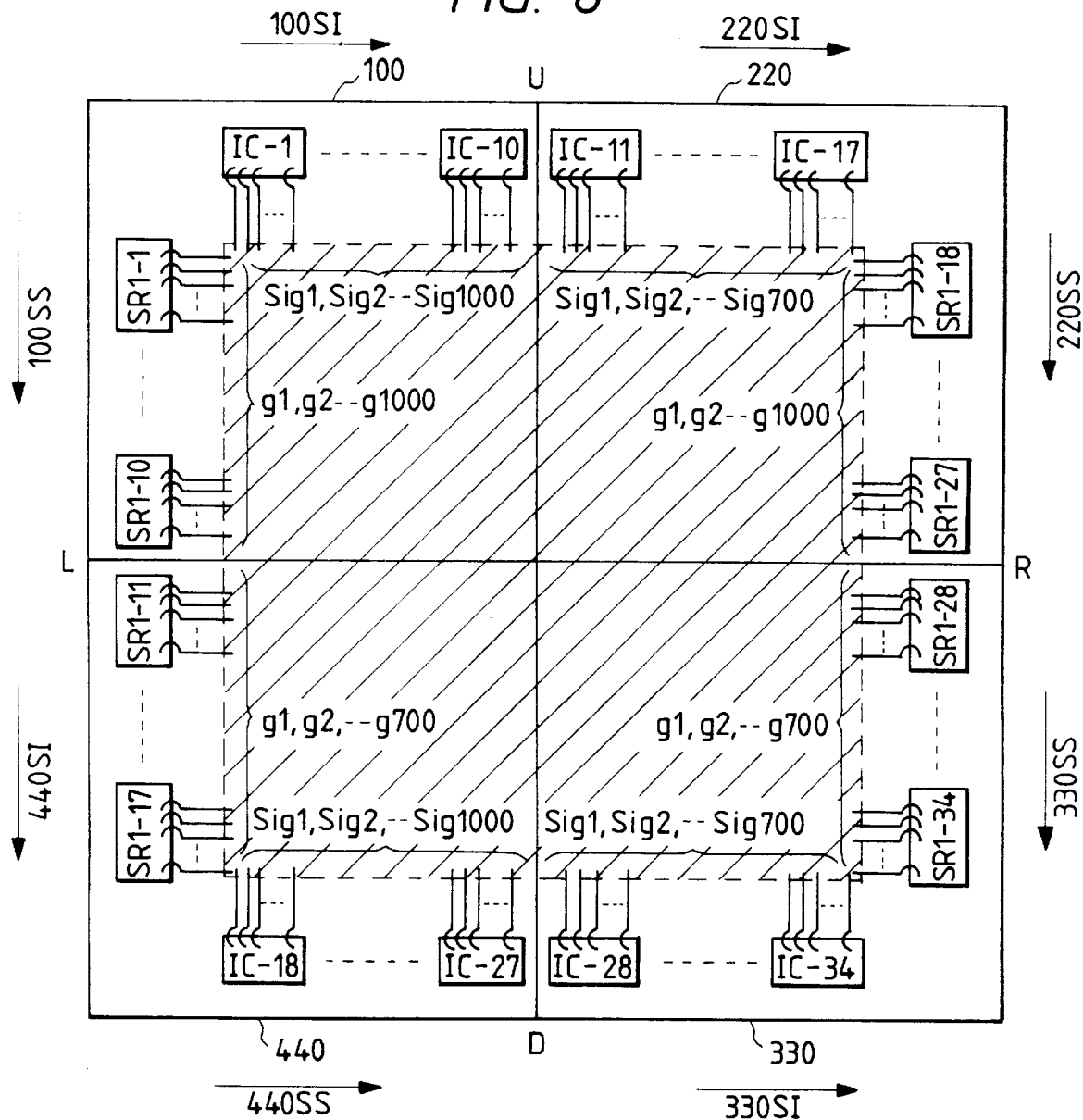
FIG. 6 is a plan view of a photoelectric converter according to a third embodiment of the present invention.

FIG. 6 is a plan view of a photoelectric converter according to a third embodiment of the present invention. The same reference numerals as are used in FIGS. 1 through 3 are used to denote corresponding or identical components.

The feature of the photoelectric converter in FIG. 6 is that the number of photoelectric conversion devices in photoelectric conversion device arrays, or the shapes in a plane of the arrays, one of which is mounted on each of four substrates, differ.

More specifically, the difference between the upper right substrate in FIG. 3 and an upper right substrate 220 in FIG. 6 is that the number of photoelectric conversion devices has been reduced from 1000×1000 to 700×1000. Accordingly, the number of signal lines is reduced from 1000 to 700, and the number of integrated detection circuits is reduced from ten to seven.

Similarly, the difference between the lower left substrate in FIG. 3 and a lower left substrate 440 in FIG. 6 is that the number of photoelectric conversion devices has been reduced from 1000×1000 to 1000×700. Accordingly, the number of signal lines is reduced from 1000 to 700, and the number of scan circuits is reduced from ten to seven.

Furthermore, the difference between the lower right substrate in FIG. 3 and a lower right substrate 330 in FIG. 6 is that the number of photoelectric conversion devices has been reduced from 1000×1000 to 700×700. Accordingly, the number of the signal lines is reduced from 1000 to 700, and the number of scan circuits is reduced from ten to seven.

Since the number of photoelectric conversion devices in an array and the shape in a plane of the array of one of the four substrates have been changed in this manner, the dimensions or the shape of the photoelectric conversion device portion of the photoelectric converter, which is constituted by bonding the four substrates together, can be changed.

More specifically, when the photoelectric converter is to be constituted by bonding four substrates together, normally, four substrates, on each of which is mounted a standard photoelectric conversion device array, are fabricated and bonded together. When a small or a large resultant photoelectric conversion device array is desired, or when a resultant photoelectric conversion array having a different shape is desired, one, two or three substrates out of four are newly fabricated, and the substrate on which is mounted the standard photoelectric conversion device array is replaced by them. In this manner, a photoelectric converter for which four desired substrates are bonded together can be provided.

As a specific example, while the photoelectric converter shown in FIG. 3 can be employed as a scanner for a standard X-ray machine for adults, the compact device shown in FIG. 6 can be used as a scanner for an X-ray machine for children.

As is described above, when a photoelectric converter is to be fabricated wherein a photoelectric conversion device array having a different shape is formed by bonding substrates together, all of the four photoelectric converters need not be fabricated; and when only one part of the photoelectric converter is newly fabricated, a desired photoelectric converter can be provided.

As a result, the cost of designing each photoelectric converter, component costs and inspection costs can be reduced, and thus the price of a product can thereby be reduced.

Fourth Embodiment

According to a fourth embodiment, provided is an X-ray machine in which a fluorescent member is provided on the photoelectric conversion device in the first to the third embodiment.

Figure 7:
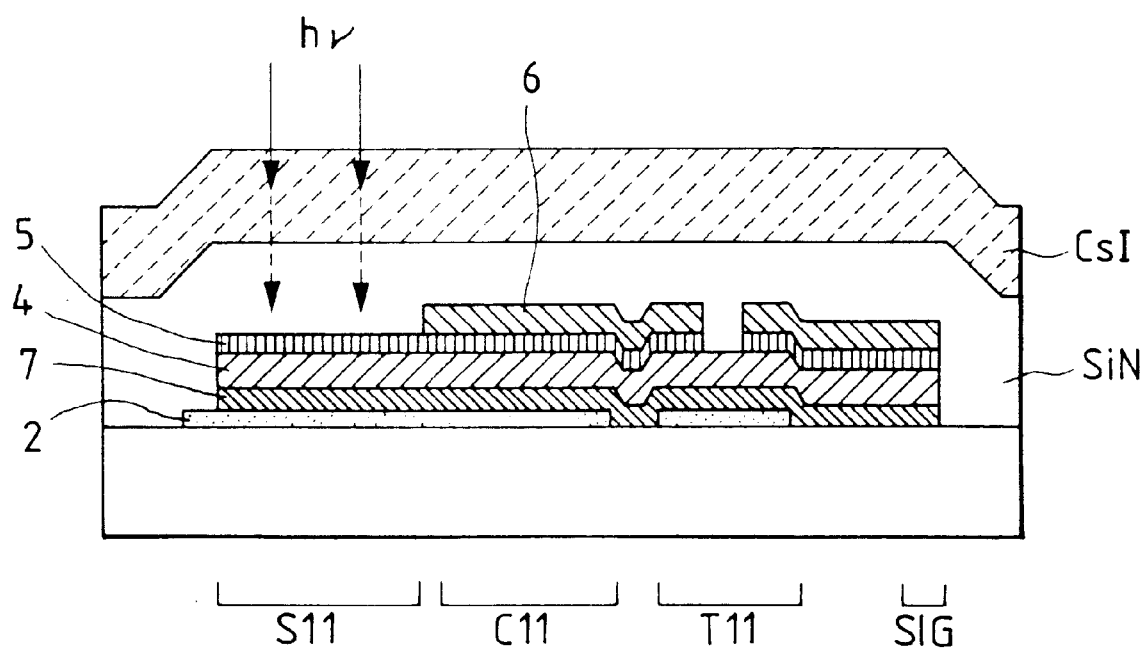
FIG. 7 is a cross sectional view of the scan structure.

The basic structure on the substrate is one wherein a light emitting layer that absorbs a high energy beam and generates visual radiation is provided on the light entering side in FIG. 5. This structure is shown in FIG. 7. A fluorescent member is deposited as a light-emitting element on a passivated film SiN. The fluorescent member may be composed of cesium iodide (CsI), and generate fluorescence when struck by an X-ray. The light-receiving device performs photoelectric conversion of the fluorescence. When 2000×2000 pixels are arranged two-dimensionally, with, for example, 5×5 pixels per 1-mm square, an X-ray detector of 40 cm×40 cm can be acquired.

A combination of this detector, which replaces an X-ray film, and an X-ray generator constitutes an X-ray machine that can be used for roentgen screening of breasts, or for examinations for mammary cancer. Unlike X-ray films, this X-ray detector can immediately display its output on a CRT, and the output can also be converted into digital output, for which image processing is performed by a computer, so that the output can be converted into an output that is consonant with the purpose of the device. The output data can be stored on a magneto-optical disk, and a quick search for previous images can be performed. The sensitivity of the detector is better than that of film, and a clear image can be provided by using an X-ray that has less adverse effect on a human body.

The method for driving a photoelectric conversion device array that is employed for the present invention will now be explained while referring to FIGS. 8 and 9. In this case, there are three scan lines for scan circuits on a single chip, while there are three data lines for the integrated detection circuits on a single chip, and a photoelectric conversion device array having a 3×3 matrix that can be driven is employed. When 10 scan circuit chips and 10 detection integrated circuit chips are employed, and when 1000 scan lines and 1000 data lines are provided and the photoelectric conversion device is a 1000×1000 matrix, it is apparent that scanning and detection for a single substrate in FIG. 3 can be performed.

Figure 8:
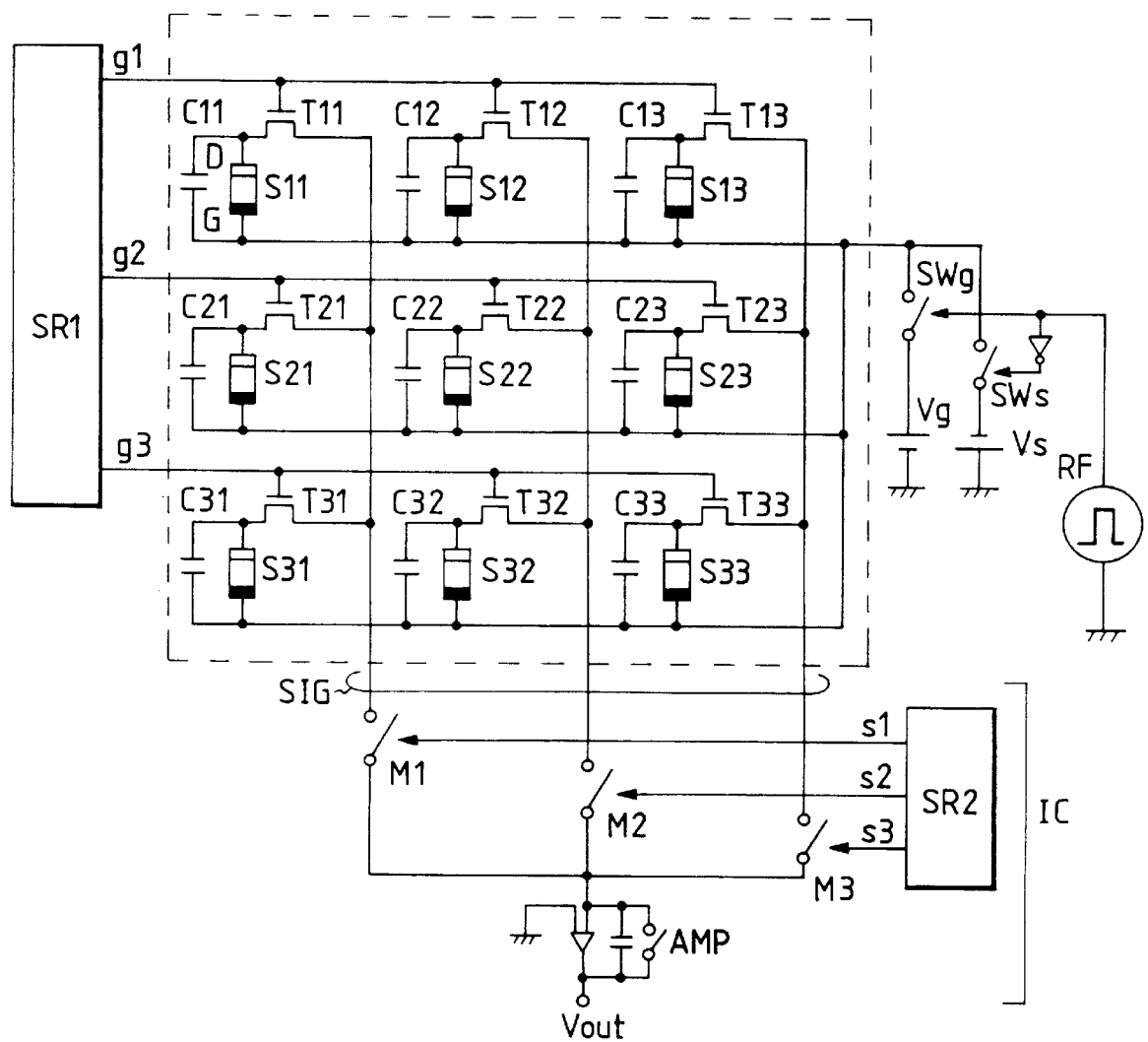
FIG. 8 is a circuit diagram for explaining a method for driving a photoelectric converter according to the present invention.

FIG. 8 is a circuit diagram for explaining a method for driving a photoelectric converter according to the present invention. The structure of individual photoelectric conversion devices (pixels) is the same as that shown in FIG. 4, 5, or 7.

In FIG. 8, S11 through S33 denote light-receiving devices, each of which has a lower electrode G and an upper electrode D. Reference numerals C11 through C33 denote storage capacitors; and T11 through T33, transfer TFTs. A reading power source is denoted by Vs and a refresh power source is denoted by Vg. The power sources Vs and Vg are connected to the electrodes G of all the photoelectric conversion devices S11 through S33 via switches SWs and SWg. The switch SWs is connected to a refresh controller RF via an inverter, while the switch SWg is connected directly to the refresh controller RF. The refresh controller RF renders switch SWg on during a refresh period. One pixel is constituted by one light-receiving device, a capacitor and a TFT, and its output signal is transmitted to a detection integrated circuit IC across a signal line SIG.

The portion that is enclosed by broken lines in FIG. 8 is formed on the same insulating substrate having large dimensions.

Figure 9:
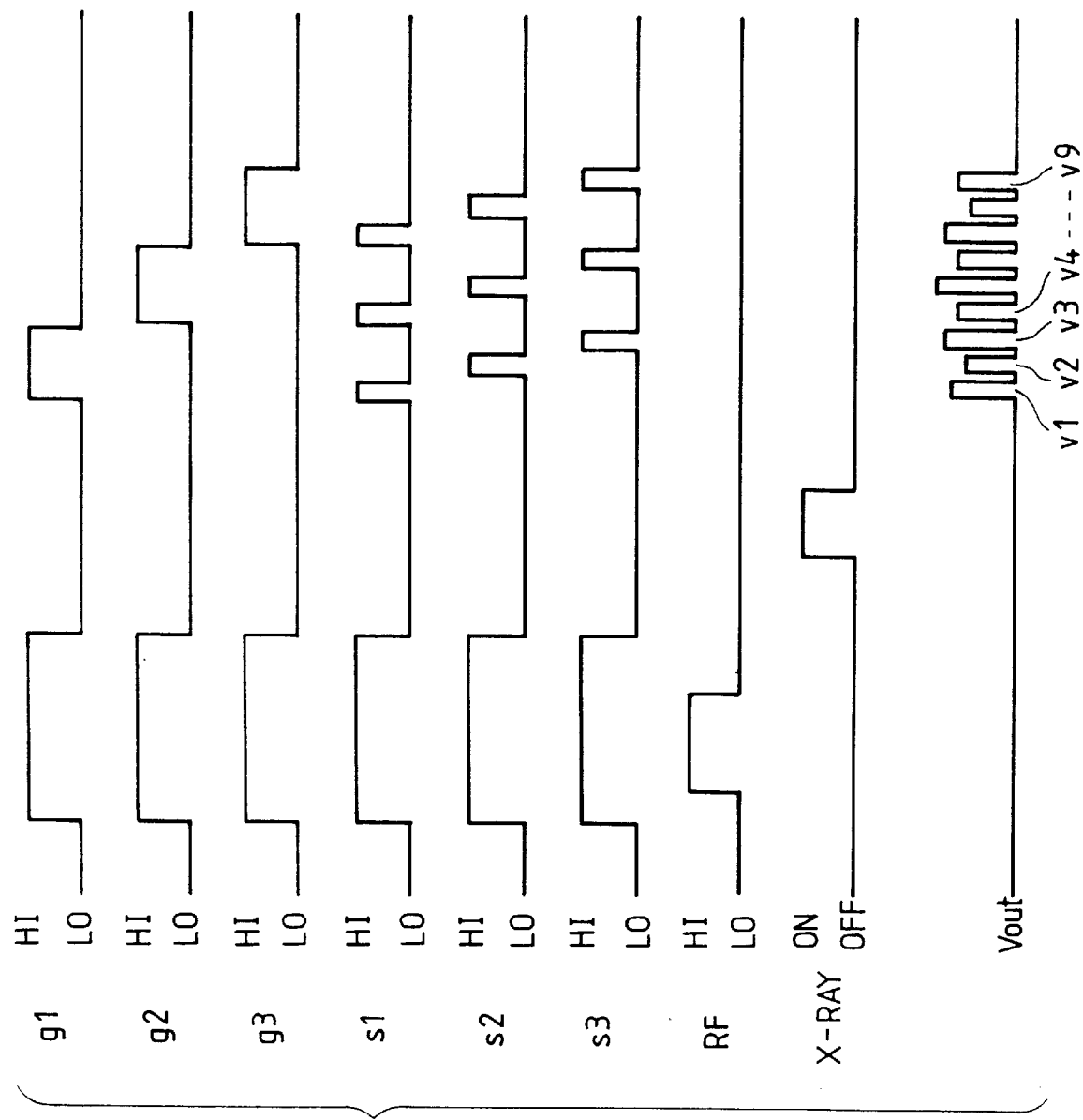
FIG. 9 is a timing chart showing the operation in FIG. 8.

FIG. 9 is a timing chart showing the operation in FIG. 8.

First, a high level pulse is applied to control lines g1 through g3 and s1 through s3 by the scan circuits SR1 and SR2. When the transfer TFTs T11 through T33, and switches M1 through M3 are rendered on and become conductive, and the electrodes D of all the light-receiving devices S11 through S33 acquire a GND potential as a reference potential because the input terminal of an integrating amplifier Amp is designed to be a GND potential. At the same time, when the refresh controller RF outputs a high level pulse and the SWg is turned on, the electrodes G of all the light-receiving devices S11 through S33 acquire a positive potential from the refresh power source Vg. Then, all of the light-receiving devices S11 through S33 are placed in the refresh mode and are refreshed. Sequentially, when the refresh controller RF outputs a low level pulse and SWs is turned on, the electrodes G of all the light-receiving devices S11 through S33 acquire a negative potential from the reading power source Vs. The light-receiving devices S11 through S33 are placed in a photoelectric conversion mode, and at the same time, the capacitors C11 through C33 are initialized. While the device is in this condition, a low level pulse is applied to the control lines g1 through g3 and s1 through s3 by the scan circuits SR1 and SR2. Then, the transfer TFTs T11 through T33 and the switches M1 through M3 are rendered off, and the electrodes D of all the light-receiving devices S11 through S33 are opened, but with their potentials being held by the capacitors C11 through C33.

Since no light beam is received at this time, no light is transmitted to the light-receiving devices S11 through S33 and a photocurrent does not flow across them. In this condition, a light beam pulse is emitted and is transmitted to the light-receiving devices S11 through S33 via an object to be exposed. An induced photocurrent that flows due to this light is stored as electric charges in the capacitors C11 through C33, and the electric charges are held therein after the transmission of a light beam has been completed.

Following this, a high level control pulse is applied to the control line g1 by the scan circuit SR1, and a control pulse is applied to the control lines s1 through s3 by the scan circuit SR2. Then, v1 through v3 are sequentially output via the switches M1 through M3 for the transfer TFTs T11 through T33. Similarly, the other light signals are sequentially output under the control of the scan circuits SR1 and SR2. Two-dimensional photo data are converted into electric signals v1 through v9. A static image is obtained by performing the above processing, while a moving image is obtained by repeating the above processing.

In this photoelectric converter, since the electrodes G of the light-receiving devices are connected in common, and the line that is used in common is connected to both the refresh power source Vg and the reading power source Vs via the switches SWg and SWs, respectively, to control the potentials of the electrodes G, all of the light-receiving devices can be switched to the refresh mode and to the photoelectric conversion mode at the same time. Therefore, light output can be obtained by using one TFT for each pixel and without requiring a complicated control system.

A photoconductive device or a photovoltaic device is employed as the light-receiving device for the photoelectric converter of the present invention. For a reason that will be described later, however, the photoelectric conversion device shown in FIG. 4, 5 or 7 is preferable.

Figure 10A:
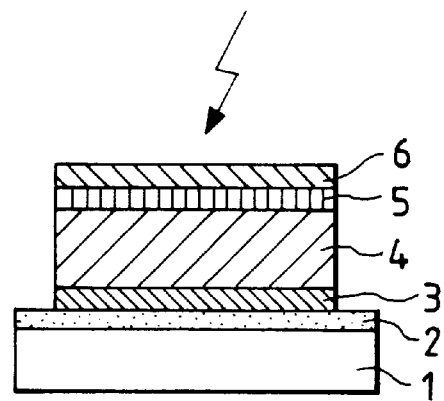
FIG. 10A is a diagram illustrating the structure of the layers of a PIN photosensor.
Figure 10B:
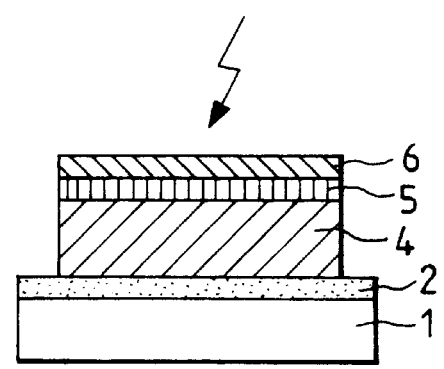
FIG. 10B is a diagram illustrating the structure of the layers of a Schottky photosensor.
Figure 10C:
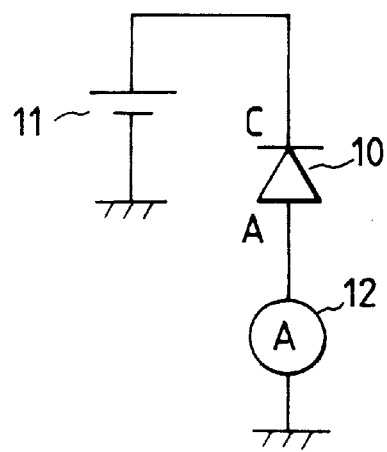
FIG. 10C is a diagram illustrating a typical commonly used driving system.

FIGS. 10A through 10C are diagrams illustrating the structure of a photosensor that serves as a light-receiving device. FIGS. 10A and 10B are diagrams illustrating the structure of the layers of two types of photosensors, and FIG. 10C is a diagram showing a typical, commonly used driving system. The photosensors in FIGS. 10A and 10B are photosensors of a photodiode type; the photosensor in FIG. 10A being called a PIN diode and the photosensor in FIG. 10B being called a Schottky diode.

In FIGS. 10A and 10B, reference numeral 1 denotes an insulating substrate; 2, a lower electrode; 3, a p semiconductor layer (hereinafter referred to as a p layer); 4, an intrinsic semiconductor layer (hereinafter referred to as an i layer); 5, an n semiconductor layer (hereinafter referred to as an n layer); and 6, a transparent electrode. In the Schottky diode in FIG. 10B, the material that is correct for the lower electrode 2 is selected, and a Schottky-barrier layer is formed so that electrons from the lower electrode 2 are not introduced into the i layer 4. In FIG. 10C, reference numeral 10 denotes the above described photosensor that is represented by using a symbol; 11, a power source; and 12, a detector, such as a current amplifier. At the photosensor 10, C denotes the transparent electrode 6 side in FIGS. 10A and 10B, and A denotes the lower electrode 2 side. The power source 11 is so set that when a positive voltage is applied at side A it is transmitted to side C.

The processing will now be briefly described. As is shown in FIGS. 10A and 10B, when light enters in the direction indicated by an arrow and reaches the i layer 4, the light is absorbed and electrons and hole carriers are generated. Since an electric field is applied to the i layer 4 by the power source 11, the electrons pass through the side C, i.e., the n layer 5, and move to the transparent electrode 6, while the hole carriers are shifted to the side A, i.e., to the lower electrode 2. As a result, a photocurrent flows across the photosensor 10. When no light enters, electrons and hole carriers are not generated in the i layer 4. The n layer 5 serves as a layer for preventing the introduction of hole carriers into the transparent electrode 6. In the PIN photosensor in FIG. 10A, the p layer 3 serves as a layer for preventing the introduction of electrons into the lower electrode 2, while in the Schottky photosensor in FIG. 10B, the Schottky-barrier layer serves as a layer for preventing the introduction of the electrons into the lower electrode 2. Therefore, the electrons and the hole carriers can not be moved and no current flows. Therefore, a current is varied depending on whether or not light enters. When this is detected by the detector 12 in FIG. 10C, the entire structure operates as a photosensor.

It is, however, difficult for the above described photosensor to be employed to produce a photoelectric converter having a high SN ratio and a low manufacturing cost. An explanation of the reasons will now be given.

The first reason is that the PIN photosensor in FIG. 10A and the Schottky photosensor in FIG. 10B require introduction prevention layers at two places. In the PIN photosensor in FIG. 10A, the n layer 5, which is an introduction prevention layer, must have such characteristics that when electrons are guided to the transparent electrode 6, that at the same time, hole carriers are prevented from being introduced into the i layer 4. If either characteristic is missing from the n layer 5, a photocurrent is reduced, or when light does not enter, a current (hereinafter referred to as a dark current) is generated and increases, which results in the deterioration of an SN ratio. The dark current is itself considered as noise, and also includes fluctuation called Schottky noise, i.e., so-called quantum noise. Even when a process for restricting a dark current is performed by the detector 12, quantum noise that accompanies the dark current can not be reduced. In order to improve the characteristics normally, generally the conditions for forming the i layer 4 and the n layer 5, and the annealing conditions after the photosensor is fabricated, must be optimized. The p layer 3, another introduction projection layer, requires the same characteristics, even though it prevents the introduction of electrons, not hole carriers, and the above described conditions for this layer must also be optimized. Normally, the conditions for optimization of the n layer and those for the p layer are not the same, and thus it is difficult to satisfy the conditions for both. In other words, it is difficult to fabricate a photosensor having a high SN ratio for which an introduction prevention layer is required at two places.

The same principle can be applied to the Schottky photosensor in FIG. 10B. Further, although for the Schottky type in FIG. 10B the Schottky-barrier layer is employed as one of the introduction prevention layers, a difference between the work functions of the lower electrode 2 and the i layer 4 is utilized. The material for the lower electrode 2 is limited, and the local level for an interface greatly affects its characteristics, so that it is more difficult to satisfy the above described condition. It is reported that a thin oxide film or a nitride film of silicon or metal of around 100 angstroms can be deposited between the lower electrode 2 and the i layer 4 in order to enhance the characteristics of the Schottky-barrier layer. According to this, hole carriers are guided to the lower electrode 2 by utilizing the tunnel effect, and the effect for the prevention of the introduction of electrons into the i layer 4 is improved. Since a difference in the work functions is also employed by this method, the material employed for the lower electrode 2 must be limited. Further, since opposite properties, i.e., the prevention of the introduction of electrons and the shifting of the hole carriers by using the tunnel effect, are employed, the oxide film or the nitride film that is formed must be very thin, around 100 angstroms, and as control of the thickness and the film quality is difficult, productivity is degraded.

Since the introduction prevention layer must be deposited at two places, productivity is degraded and manufacturing costs are increased. Since the characteristics of the introduction prevention layer are important, a photosensor wherein a defect occurs in even one of these layers can not provide the characteristics required for a photosensor.

Figure 11:
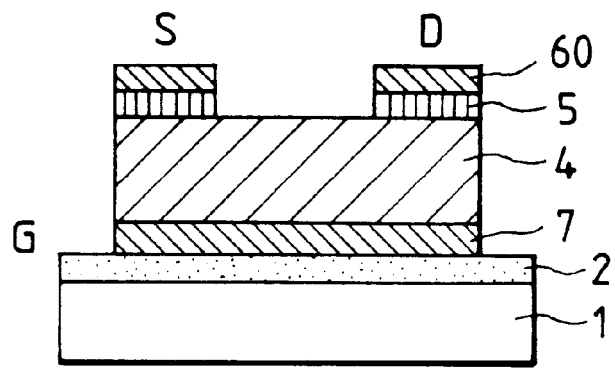
FIG. 11 is a diagram illustrating the layer structure of a field-effect transistor (TFT) that is constituted by a thin semiconductor film.

The second reason will now be described while referring to FIG. 11. FIG. 11 is a diagram illustrating the layered structure of a field-effect transistor (TFT) that is constituted by a thin semiconductor film. The TFT is sometimes used as a part of a control section in order to fabricate a photoelectric converter. The same reference numerals as are used in FIGS. 10A to 10C are also used to denote corresponding or identical layers. In FIG. 11, reference numeral 7 denotes an insulating film and 60 denotes an upper electrode. The deposition method will be sequentially described. On an insulating substrate 1 are sequentially deposited a lower electrode 2 that serves as a gate electrode (G), a gate insulating film 7, an i layer 4, an n layer 5, and an upper electrode 60 that serves as a source electrode (S) and a drain electrode (D). Etching is performed on the upper electrode 60 to form the source electrode (S) and the drain electrode (D), and then etching is performed on the n layer 5 to form a channel portion. Since, as a characteristic of the TFT, it is sensitive to the condition of the interface between the gate insulating layer 7 and the i layer 4, generally, the above layers are sequentially formed in a vacuum to prevent contamination.

When a conventional photosensor is to be formed on the same substrate as the TFT, the above described layer structure becomes a problem, and results in an increase in manufacturing costs and in the degrading of the characteristics. This is because the structures of the photosensors in FIGS. 10A to 10C and of the TFT are different; the structure of the PIN photosensor in FIG. 10A is an electrode/p layer/i layer/n layer/electrode lamination, and the structure of the Schottky photosensor in FIG. 10B is an electrode/i layer/n layer/electrode lamination, while the structure of the TFT is an electrode/insulating film/i layer/n layer/electrode lamination. This means that the photosensor and the TFT can not be fabricated by the same process, and complicated processing results in a degradation of the yielding ratio and an increase in the manufacturing costs. The etching procedure for the gate insulating layer 7 and the p layer 3 is required in order to use the i layer/n layer in common. The p layer 3 and the i layer 4, which are the above described important introduction prevention layers for the photosensor, can not be deposited in the same vacuum, for the interface between the gate insulating film 7 and the i layer 4, which is important for the TFT, is contaminated when the gate insulating film is etched. As a result, the characteristics are deteriorated and the SN ratio is reduced.

In the Schottky photosensor in FIG. 10B, wherein an oxide film or a nitride film is formed between the lower electrode 2 and the i layer 4 to enhance its characteristics, although the order of film formation is the same as that shown in FIG. 11, the oxide film or the nitride film must be so formed that it is around 100 angstroms, as is described above, and it is difficult to employ that film as the gate insulating film.

Figure 12:
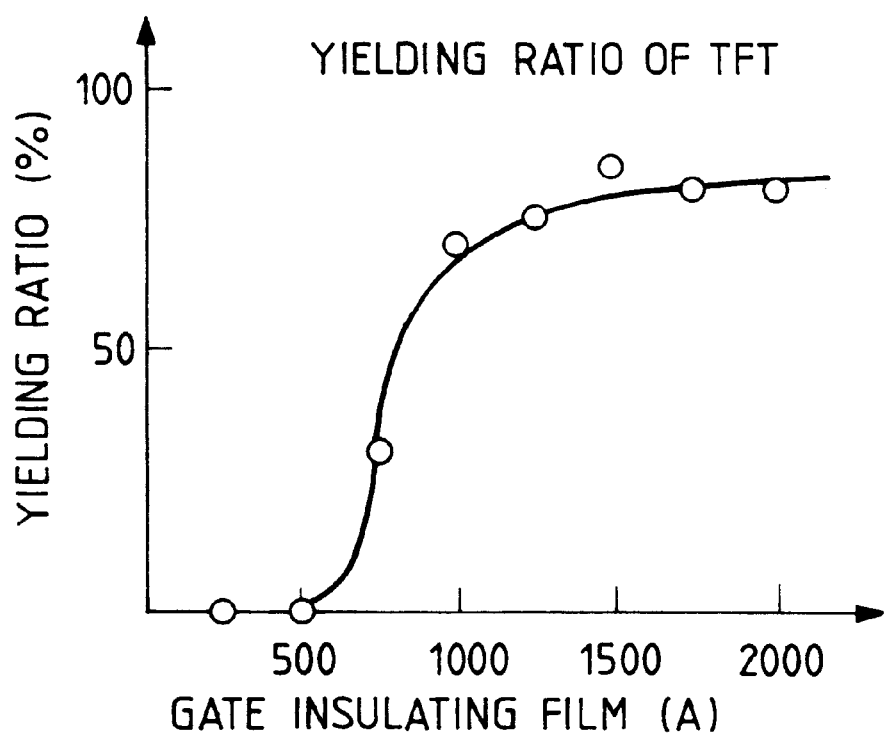
FIG. 12 is a graph showing our experimental results for an gate insulating film and a yielding ratio or manufacturing efficiency for the TFT.

FIG. 12 is a graph showing our experimental results for the gate insulating film and the yielding ratio for the TFT. With a gate insulating film of 1000 angstroms or less, the yielding ratio dropped drastically. With a gate insulating film of 800 angstroms, the yielding ratio was about 30%; with a film of 500 angstroms, the yielding ratio was 0%; and with a film of 250 angstroms, it was not even possible to confirm the operation of the TFT. As is apparent from the data, it is difficult to use an oxide film or a nitride film of a photosensor that employs the tunnel effect as the gate insulating film for a TFT that must insulate electrons and hole carriers.

Further, though not shown, it is difficult for a capacity device (hereafter referred to as a capacitor), which is a device that is required for obtaining the integral values of electric charges or of a current, to be fabricated so that it has the same structure as that of the photosensor, and so that it has a preferable characteristic for reducing leakage. Since the capacitor stores electric charges between two electrodes, a layer for preventing the movement of electrons and hole carriers must be formed as an intermediate layer between the electrodes. However, since the conventional photosensor uses only a semiconductor layer between the electrodes, it is difficult to obtain an intermediate layer that has a preferable characteristic for thermally reducing leakage.

As is described above, the processing and the characteristics of the TFT and the capacitor, which are important devices for a photoelectric converter, do not correspond with each other. Because of this problem, procedures are increased and are made more complicated for the fabrication of a system wherein a plurality of photosensors are two-dimensionally arranged and light signals are sequentially detected. This results in a deterioration of the yielding ratio, and prevents the production of a device having a low manufacturing cost and high performance and multiple functions.

What is claimed is:

1. A photoelectric converter comprising a plurality of substrates, on which photoelectric conversion devices are mounted two-dimensionally, wherein each of said plurality of substrates includes a portion of said photoelectric conversion devices contacting two adjacent sides of said substrate, and a circuit portion along the other two adjacent sides and connected to said portion of said photoelectric conversion devices, wherein four of said substrates having the same structure are positioned by being rotated 90°, said substrates being bonded together with two being positioned vertically and horizontally, so that said photoelectric conversion device portions lie adjacent to each other in a plane with no intervening gaps.

2. A photoelectric converter according to claim 1, wherein mounted on each of said substrates are said photoelectric conversion device portions in which are a first electrode layer, an insulating layer, a photoelectric conversion semiconductor layer, and a semiconductor layer for preventing introduction of a first conductive carrier;

photoelectric conversion means for retaining, in said photoelectric conversion semiconductor layer, said first conductive carrier that is generated by signal light that has entered there and for applying an electric field to said photoelectric conversion devices in a direction in which a second conductive carrier, which is different from said first conductive carrier, is guided to said second electrode layer;

refresh means for applying an electric field, to said photoelectric conversion devices, in a direction in which said first conductive carrier is guided from said photoelectric conversion semiconductor layer to said second electrode layer; and a signal detector for, during photoelectric conversion by photoelectric conversion means, detecting said first conductive carrier that is stored in said photoelectric conversion semiconductor layer, or said second conductive carrier that is guided to said second electrode layer.

3. A photoelectric converter according to claim 1, wherein fluorescent members are positioned on upper portions of said photoelectric conversion devices to constitute an X-ray detector.

4. A photoelectric converter according to claim 1, wherein driving circuits are provided on four sides of said photoelectric converter.

5. A photoelectric converter according to claim 4, wherein said driving circuits are a plurality of scan circuit chips having the same structure and a plurality of detection circuit chips having the same structure.

6. A photoelectric converter according to claim 4, wherein scanning directions for said driving circuits that are provided along the same side of said photoelectric converter differ.

7. A photoelectric converter according to claim 5, wherein said scan circuits and said detection circuits are provided along each side of said photoelectric converter.

8. A photoelectric converter according to claim 5, wherein said scan circuits and said detection circuits are constituted by a plurality of IC chips having the same structure.

9. A photoelectric converter according to claim 1, wherein said photoelectric conversion devices have amorphous semiconductor light-receiving portions.

10. A photoelectric converter according to claim 1, wherein said photoelectric conversion devices have a conversion element.

11. A photoelectric converter according to claim 10, wherein said conversion element is a fluorescent member.

12. A photoelectric converter according to claim 5, wherein said scan circuits and said detection circuits are provided along each side of said photoelectric converter.

13. A photoelectric converter according to claim 1, wherein a plurality of scan circuit chips and a plurality of detection circuit chips are provided along each side of said photoelectric converter.

14. A photoelectric converter according to claim 1, wherein mounted on said substrate are a photoelectric conversion device array portion, which is so formed as to contact two adjacent sides, and a driving circuit portion, which is formed along the other two adjacent sides and that is connected to said photoelectric conversion device array portion; wherein four of said substrates are bonded together with two each being positioned vertically and horizontally, so that said photoelectric conversion device array portions lie adjacent to each other in a plane; and wherein the number, or the shape in a plane, of said photoelectric converter device arrays mounted on at least one of said four substrates differs from the number, or the shape in a plane, of said photoelectric conversion device arrays mounted on at least one of the other three substrates.

15. A photoelectric converter according to claim 14, wherein driving circuits are provided on four sides of said photoelectric converter.

16. A photoelectric converter according to claim 15, wherein said driving circuits are a plurality of scan circuit chips having the same structure and a plurality of detection circuit chips having the same structure.

17. A photoelectric converter according to claim 14, wherein scanning directions for said driving circuits that are provided along the same side of said photoelectric converter differ.

18. A photoelectric converter according to claim 14, wherein said photoelectric conversion devices have a conversion element.

19. A photoelectric converter according to claim 18, wherein said light conversion element is a fluorescent member.

20. A photoelectric converter according to claim 16, wherein said scan circuits and said detection circuits are provided along each side of said photoelectric converter.

21. A photoelectric converter according to claim 16, wherein said scan circuits and said detection circuits are respectively constituted by a plurality of IC chips having the same structure.

22. A photoelectric converter according to claim 14, wherein said photoelectric converter and a high energy beam generator constitutes a pickup apparatus.

23. A photoelectric converter according to claim 2, wherein fluorescent members are positioned on upper portions of said photoelectric conversion devices to constitute an X-ray detector.

24. A photoelectric converter, wherein a plurality of substrates, on which photoelectric conversion elements are mounted two-dimensionally, wherein mounted on a photoelectric conversion element array of said substrates are said photoelectric conversion elements, said array portion is so formed as to contact two adjacent sides of said substrate and a driving circuit portion, which is formed along the other two adjacent sides and that is connected to said photoelectric conversion elements wherein four of said substrates are bonded together with two being positioned vertically and horizontally, so that said photoelectric conversion element array portions lie adjacent to each other in a plane; and wherein the number, or the shape in a plane, of said photoelectric conversion elements mounted on said photoelectric conversion element array portion of at least one of said four substrates differs from the number, or the shape in a plane, of said photoelectric conversion elements mounted on said photoelectric conversion element array portion of at least one of the other three substrates, and wherein said photoelectric conversion elements have amorphous semiconductor light-receiving portions.

25. A photoelectric converter comprising four substrates, each of said substrates bearing a photoelectric conversion element array portion which contacts two adjacent sides, and a driving circuit portion along the other two adjacent sides that is connected to photoelectric conversion elements mounted on said photoelectric conversion element array portion; wherein four of said substrates are bonded together with two each being positioned vertically and horizontally, so that said photoelectric conversion element array portions lie adjacent to each other in a plane; and wherein number of gate lines, number of signal lines, the number or the shape in a plane of photoelectric conversion elements mounted on said photoelectric conversion element array portion of each of said four substrates differs from each other.

* * * * *

UNITED STATES PATENT AND TRADEMARK OFFICE
CERTIFICATE OF CORRECTION

PATENT NO. : 5,912,465
APPLICATION NO. : 08/697789
DATED : June 15, 1999
INVENTOR(S) : Isao Kobayashi et al.

It is certified that error appears in the above-identified patent and that said Letters Patent is hereby corrected as shown below:

COLUMN 2

Line 19, "odd numbered" should read --odd-numbered--;
Line 20, "even numbered" should read --even-numbered--; and
Line 34, "be" should read --the--.

COLUMN 4

Line 29, "efficiency" should read --manufacturing efficiency--;
Line 36, "and" (second occurrence) should be deleted; and
Line 61, "the least" should read --least--.

COLUMN 5

Line 6, "cross sectional" should read --cross-sectional--;
Line 9, "cross sectional" should read --cross-sectional--;
Line 13, "cross sectional" should read --cross-sectional--;
Line 29, "an" should read --a--;
Line 67, "structured" should read --structure--.

COLUMN 7

Line 6, "a small" should read --small a--.

COLUMN 9

Line 52, "embodiment." should read --embodiments.--.

COLUMN 11

Line 65, "above described" should read -- above-described--.

COLUMN 12

Line 26, "above described" should read -- above-described--:
Line 53, "above described" should read -- above-described--: and
Line 67, "above" should read --above- --.

UNITED STATES PATENT AND TRADEMARK OFFICE
CERTIFICATE OF CORRECTION

PATENT NO. : 5,912,465
APPLICATION NO. : 08/697789
DATED : June 15, 1999
INVENTOR(S) : Isao Kobayashi et al.

It is certified that error appears in the above-identified patent and that said Letters Patent is hereby corrected as shown below:

COLUMN 13

Line 25, "sometime" should read --sometimes--;
Line 45, "above described" should read --above-described--; and
Line 61, "above described" should read --above-described--.

COLUMN 15

Line 61, "converter" should read --conversion--.

COLUMN 16

Line 13, "light" should be deleted;
Line 61, "number" should read --the number--; and
Line 62, "number" (first occurrence) should read --the number--.

Signed and Sealed this

Twelfth Day of September, 2006

JON W. DUDAS
*Director of the United States Patent and Trademark Office*